United States Patent [19]
Cornelius

[11] Patent Number: 5,056,144
[45] Date of Patent: Oct. 8, 1991

[54] FAST SWITCHING DRIVE CIRCUIT FOR A FERRI-RESONANT OSCILLATOR

[75] Inventor: William P. Cornelius, Sunnyvale, Calif.

[73] Assignee: Hewlett-Packard Company, Palo Alto, Calif.

[21] Appl. No.: 597,970

[22] Filed: Oct. 15, 1990

[51] Int. Cl.$^5$ ............................................. H03B 5/18
[52] U.S. Cl. ...................................... 331/49; 331/96; 331/179
[58] Field of Search ................... 331/49, 96, 107 DP, 331/117 D, 179

[56] References Cited
U.S. PATENT DOCUMENTS 4,536,722 8/1985 Kaye et al. ..................... 331/117 D
4,581,594 4/1986 Kennedy ......................... 331/177 R Primary Examiner—Siegfried H. Grimm

[57] ABSTRACT

Apparatus for allowing low noise and fast frequency switching of a ferri-resonant oscillator, such as YIG, that uses a coil to control output signal frequency by current level. The apparatus positions an active filter in parallel with the oscillator coil, which can be set to one of two impedance levels. A low impedance level provides low pass filtering of the current to the oscillator coil for low noise operation. A second high impedance level allows fast settling of transients during frequency changes. Once current levels have stabilized, the active filter can then be switched to low impedance mode without creating a significant transient. This facilitates fast frequency switching.

13 Claims, 3 Drawing Sheets

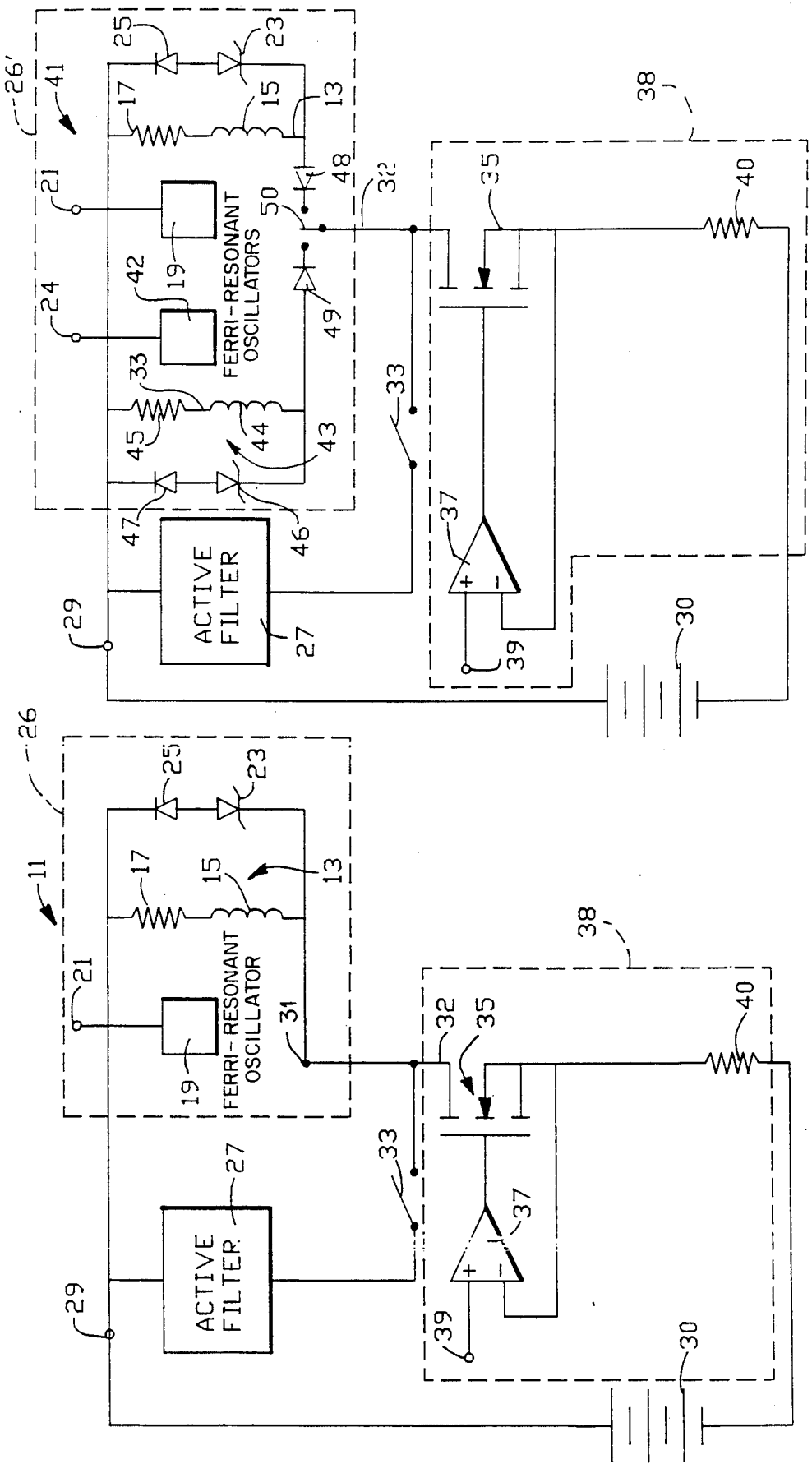

FAST SWITCHING DRIVE CIRCUIT FOR A FERRI-RESONANT OSCILLATOR

TECHNICAL FIELD

This invention relates to a drive circuit for a ferri-resonant microwave oscillator, such as a YIG oscillator, that allows low noise, fast frequency switching of the output signal.

BACKGROUND ART

In any microwave signal generator that employs an yttrium-iron-garnet ("YIG") or other ferri-resonant oscillator material, the microwave output signal frequency is proportional to the current flowing in the oscillator coil. The output signal frequency can be shifted quickly by shifting the current level quickly.

Kaye et al., in U.S. Pat. No. 4,536,722, observes that a capacitive filtering means is usually required across the input terminals of a YIG oscillator to suppress noise and similar problems. The presence of the capacitive filter introduces time lag and response delay problems and ringing, where the frequency is to be changed quickly. Kaye et al. provide switching means for selectively connecting the capacitive filtering means across the input terminals and disconnecting the capacitive filtering means at times when the frequency is to be changed. The capacitive element is charged to its new value before the filtering means is reconnected. Protection of the YIG oscillator during these times of change is not discussed in this patent.

In U.S. Pat. No. 4,581,594, Kennedy discloses a low noise drive circuit for YIG-tuned oscillators in which a feed-back loop containing the oscillator coil is selectively activated or deactivated in order to control the tuning current passing through the oscillator coil.

What is needed here is a low-noise current driver for the oscillator coil that operates in a low noise first state when the current input is stable and switches to a second state which allows fast settling when a transition occurs from one current level to another current level. The drive circuit should manifest low noise at all relevant frequencies in the first, stable state, and should permit switching from one current level to another at times on the order of 1–20 msec in the second state. The current driver must be made with readily-available and reliable parts (low failure rate). It is preferable that the circuit not require current surges from power source during current level transitions. Preferably, the current driver should be capable of withstanding any transient voltage levels which will occur during current level transitions.

SUMMARY OF THE INVENTION

These needs are met by current drive circuit apparatus that includes an oscillator coil, having an input terminal to receive a current input signal and having an output terminal, that is part of an oscillator. The oscillator device also includes a ferri-resonant ("FR") element and a magnetic structure. The oscillator coil is connected between the input terminal and the output terminal of the oscillator interface circuit and has an internal impedance $Z_c$. The oscillator interface circuit further includes voltage limitation means (diodes or other means) for controlling the voltage developed between the coil input and output terminals. The apparatus further includes a current drive module connected at one of its nodes to the input terminal of the oscillator coil to provide a controllably variable current for the circuit.

The current drive module includes a current source that produces a desirable dc current component and an undesirable ac noise current component. Ideally, the ac noise current should not pass through the oscillator coil associated with the FR element. The apparatus further includes an active filter, having an input terminal connected to the oscillator coil circuit input terminal and having an output terminal connected to the oscillator coil circuit output terminal, where the active filter has a frequency-dependent internal impedance approximately equal to $Z_{A1}$ if the input signal has frequency that is less than a first selected frequency $f_1$ and has internal impedance approximately equal to $Z_{A2}$ if the input signal has a frequency at least equal to a second frequency $f_2$ with $f_1 < f_2$. The ratio of the absolute values of the impedances satisfy the relations $$|Z_c|/|Z_{A1}| << 1,$$

$$|Z_c|/|Z_{A2}| >> 1.$$

The active filter acts as a shunt to divert an increasing amount of the ac component of the current through itself, rather than through the oscillator coil circuit, as the frequency of the ac component increases above a predetermined frequency threshold value such as 5Hz.

The apparatus also includes an electronically controllable switch that connects the current supply node to the active filter input terminal in a first switch state and that severs this connection in a second switch state (when the current level is being switched). Optionally, the apparatus includes a second oscillator device for improved operation in two or more different output frequency regimes.

Noise in the current produced by the current drive module arises from the noise spectra of a digital-to-analog converter, if any, and other signal processing components used together with the current drive module. This noise, if not filtered or otherwise suppressed, will induce additional signals, in the form of unwanted frequencies impressed on the microwave output at the circuit output terminal. Use of the active filter reduces the noise associated with the oscillator coil current to an acceptably small level and keeps coil current nearly equal to source current in the desired source current regime (i.e., dc). The active filter impedance decreases approximately 20 dB per decade in frequency, and the oscillator coil impedance increases approximately 20 dB per decade. These two impedances have equal magnitude at a frequency of approximately 10Hz so that most of the high frequency (noise) component of the current is shunted through the active filter and does not pass through the oscillator circuit.

The apparatus must also allow fast switching of the current in the oscillator coil from one dc current level to another such level, with a settling time for transients induced by this switching of the order of 1–20 msec. The impedances present in the oscillator circuit and in the active filter circuit would have unacceptably long settling times in response to this switching. To promote fast switching with acceptably short settling times, the active filter is disconnected during current level switching. This also protects the active filter from possible damage arising from the switching action itself. After the new current level in the oscillator coil is established, the active filter circuit is reconnected, with this filter being switched to a second (nonfiltering) mode. The active filter, when reconnected in this second mode, quickly settles to a steady state that approximately matches the state the active filter would attain in its first (filtering) mode with the dc current at its new level. The active filter is then switched back to its first mode, with little or no additional transient behavior, and proceeds to shunt most of the high frequency component of current through itself as before.

BRIEF DESCRIPTION OF THE DRAWINGS

FIGS. 1 and 2 are schematic views of two embodiments of the invention.

BEST MODE FOR CARRYING OUT THE INVENTION

Figure 3:
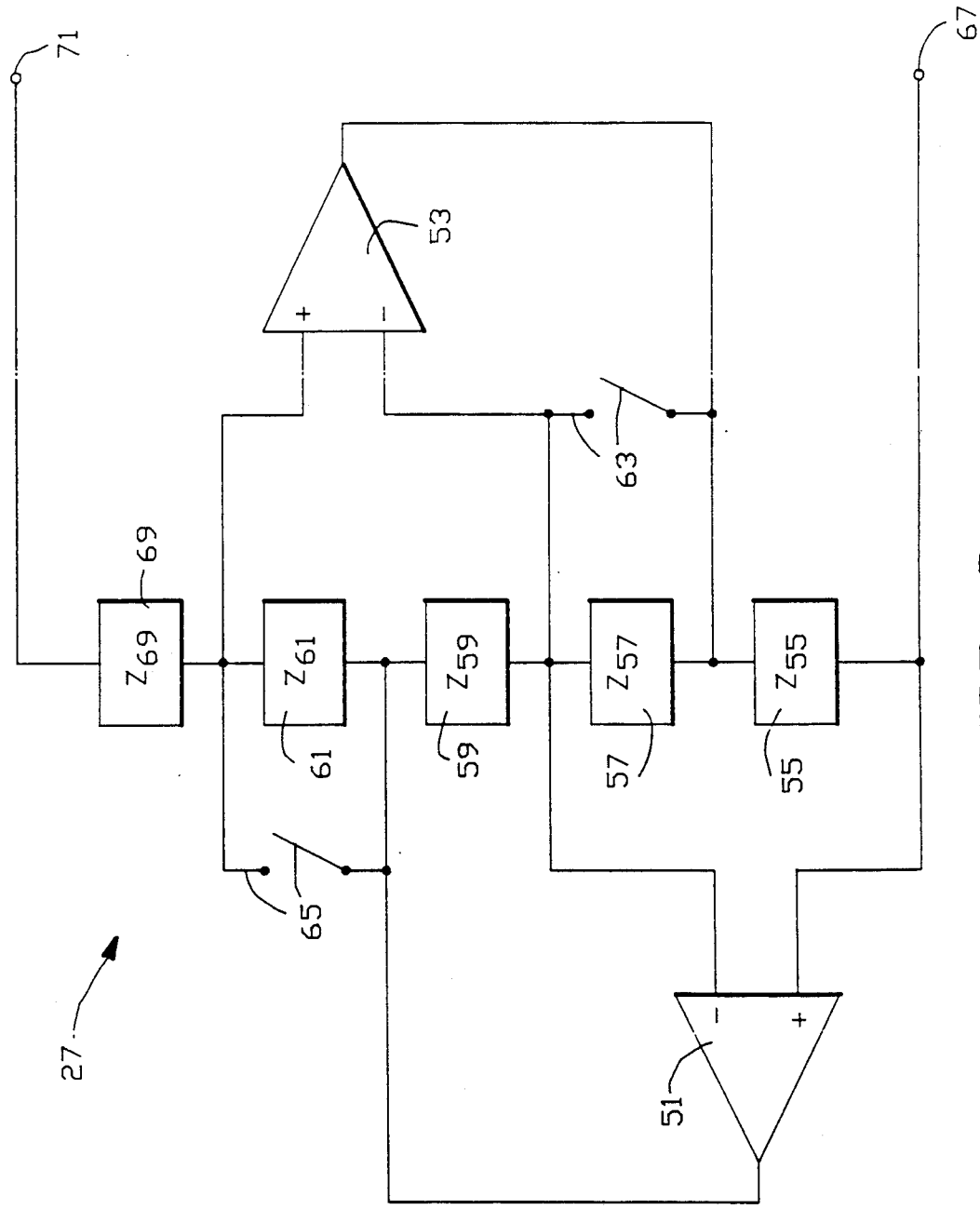
FIG. 3 is a schematic of a preferred embodiment of the active filter shown in FIG. 1.

With reference to FIG. 1, a first embodiment 11 of apparatus embodying the invention includes an oscillator coil 13, having first and second terminals, that manifests inductive and resistive properties, indicated by the presence of an inductive element 15 and a resistive element 17 in the coil 13. A ferri-resonant oscillator 19 may include a ferri-resonant ("FR") material such as yttrium iron garnet ("YIG"), barium ferrite or similar material that resonates at a microwave frequency when it is placed in a dc magnetic field. If the ferri-resonant material is shaped as a sphere, the resonant frequency is determined only by the magnitude of the dc magnetic field and is a consequence of orientation and precession of the electron spins of the atoms in the imposed magnetic field. The dc magnetic field is produced by current flow through a solenoid enclosed in a magnetic structure. The example, are discussed at length by J. Helszajn in *YIG Resonators and Filters,* John Wiley & Sons, 1985, pp. 1–64, which is incorporated by reference herein. When current flows in the oscillator coil 13, a dc magnetic field is created and a microwave signal appears at the output terminal 21 of the ferri-resonant oscillator.

The oscillator coil 13 has an input terminal and an output terminal and is arranged in parallel with a series combination of a Zener diode 23 and a conventional diode 25, positioned anode-to-anode, to provide voltage clamping and to allow current flow only in one direction. The oscillator coil 13, ferri-resonant oscillator 19, output signal terminal 21 and voltage clamping diodes 23 and 25 together form an oscillator interface circuit 26 that provides a high frequency output signal, given a current input signal.

An active filter module 27 is positioned in parallel with the oscillator coil 13 so that the output terminals of the diode 25, the oscillator coil 13 and the active filter module 27 are all connected to a network node 29 that, in this embodiment, connects to a static voltage source 30. The input terminals of the diode 23, oscillator coil 13 and filter module 27 are all connected to a network node 31 that connects to a current source, described below. The input terminal of the filter module 27 is connected across a controllable switch 33 (optional) to the node 31 and to a first terminal (drain) of an MOS transistor 35. A gate or second terminal of the MOS transistor 35 is driven by the output terminal of an operational amplifier ("op.amp.") 37, whose positive input terminal receives a current level control input signal from a driver circuit input terminal 39. The negative input terminal of the op.amp. 37 is connected to a third terminal (source) of the MOS transistor 35 and through a current-limiting resistor 40 to the lower voltage terminal of the static voltage source 30. The MOS transistor 35, the op. amp. 37, the input terminal 39 and the current-limiting resistor 40 together form a current driver circuit 38.

FIG. 1 illustrates the use of a single oscillator device, including the oscillator 19, in the oscillator interface circuit 26 to provide a microwave output signal at the ferri-resonant oscillator output terminal 21. FIG. 2 illustrates an embodiment 41 that uses two oscillator devices with associated oscillator coils 13 and 43 in a similar oscillator interface circuit 26', which may be used for different frequency regimes to produce the desired microwave output signal. The second oscillator coil 43 is arranged in parallel with a series combination of a second Zener diode 46 and a second conventional diode 47, with the diode anodes being connected together. The cathode terminal of the Zener diode 46 is connected to a first terminal of the oscillator coil 43 and to the anode terminal of a conventional diode 49. The negative terminal of the conventional diode 47 is connected to a second terminal of the oscillator coil 43. Another conventional diode 48 has its anode connected to the first terminal of the first oscillator coil 13. The cathode terminals of the two conventional diodes 48 and 49 are connected to a switch 50 that controllably connects a current input line 32 to one or the other of the two diodes 48 and 49. The oscillator coils 13 and 43, the oscillators 19 and 42, the output signal terminals 21 and 24, the voltage clamping diodes 23, 25, 46 and 47, the current control diodes 48 and 49, and the switch 50 together form a second embodiment of an oscillator interface circuit 26' that provides a high frequency output signal in each of two selected frequency ranges from a current input signal delivered in a first or second current range.

In this embodiment 41, current in one regime (e.g., 30–110 mA dc current) is caused to flow through the circuit associated with the second oscillator coil 43. Current in another regime (e.g., 110–300 mA dc current) is caused to flow through the circuit associated with the first oscillator coil 13. Only one of these two circuits is active at any one time. Switching between the two oscillator circuits associated with the two oscillator coils 13 and 43 is controlled by the switch 50 that connects the current input line 32 to the cathode of the diode 48 or, alternatively, to the cathode of the diode 49 as shown. Within each of the first current regime and the second current regime, the magnitude of the dc current may vary and, correspondingly, the frequency of the microwave output signal at the output terminal 21 or 24 may vary.

FIG. 3 illustrates one embodiment of the active filter module 27 used in each of FIGS. 1 and 2. The filter module 27 has first and second operational amplifiers 51 and 53, respectively. First and second impedance sources 55 and 57 ("impedors") each having an input terminal and an output terminal, are connected in series, with a first terminal of the first impedor 55 being connected to the positive input terminal of the first op. amp. 51, and with a second terminal of the first impedor 55 and a first terminal of the second impedor 57 being connected together. Each impedor, such as 55 or 57, may include a series and/or parallel combination of resistors, capacitors and inductors. Each impedor, such as 55 or 57, used here is preferably primarily resistive, as opposed to reactive, unless indicated otherwise. Third and fourth impedors 59 and 61 (primarily resistive), each having two terminals, are connected in series so that a first terminal of the third impedor 59 is connected to a second terminal of the second impedor 57 and to the negative input terminals of each of the first and second op. amps. 51 and 53. A second terminal of the third impedor 59 is connected to a first terminal of the fourth impedor 61, and a second terminal of the fourth impedor 61 is connected to the positive input terminal of the second op. amp. 53. The output terminals of the two op. amps. 51 and 53 are each connected to the second terminal of the third impedor 59 and to the second terminal of the first impedor 55, respectively.

A first switch 63 is connected between the first and second terminals of the second impedor 57, and a second switch 65 is connected between the first and second terminals of the fourth impedor 61, as shown in FIG. 3. An input terminal 67 of the active filter module 27 is connected to the first terminal of the first impedor 55. The second terminal of the fourth impedor 61 is connected across a primarily capacitive impedor 69 to an output terminal 71 of the active filter module 27. The first, second, third and fourth impedors 55, 57, 59 and 61 are preferably resistors having the resistance values 1 kilo-ohm, 12 kilo-ohms, 1 kilo-ohm and 12 kilo-ohms, respectively. The impedor 69 is preferably a capacitor with the capacitance value C=1 microfarad ($\mu$f). The arrangement of impedors 55, 57, 59, 61 and 69 and op. amps. 51 and 53 shown in FIG. 3 has an impedance Z between the terminals 67 and 71 given by $$Z = (Z_{55} \cdot Z_{59} \cdot Z_{69})/(Z_{57} \cdot Z_{61}). \quad (1)$$

See A. S. Sedra and P. O. Brackett, *Filter Theory and Design: Active and Passive*, Matrix Publishers, Inc., Champaign, Ill., 1978, pp. 417–426 for a discussion of this result.

The first and second switches 63 and 65 in FIG. 3 are operated together so that both switches are in the open position or both switches are in the closed position at the same time. However, these two switches need not be caused to transition from an open state to a closed state, or from a closed state to an open state, at precisely the same time. When the two switches are in the open position and the active filter is in the filtering mode, the internal impedance Z of the active filter module 27 between the first terminal of the first impedor 55 and the second terminal of the fifth impedor 69 is approximately equal to $Z_A(s) = 1/144Cs$ ($s = 2\pi j$). When the first and second switches 63 and 65 are in the closed position and the active filter is in the non-filtering mode, taking into account the switch impedances of about 100 Ohms each, the internal impedance Z between these two nodes is approximately equal to $Z_B(s) = 100/Cs$. Thus, the active filter module provides a four order-of-magnitude change, or more, in internal impedance, depending upon the states of the two switches 63 and 65. The impedance $Z_A(s)$ of the active filter module 27 in the filtering mode has a low frequency value $Z_{A1}$ and a high frequency value $Z_{A2}$ that satisfy the relations $$|Z_c|/|Z_{A1}| << 1, \quad (2)$$

$$|Z_c|/|Z_{A2}| >> 1, \quad (3)$$

relative to the oscillator coil impedance $Z_c$, which is about 50 Ohms at low frequencies. The active filter impedance $Z_B$ in the non-filtering mode satisfies the relation $$|Z_c|/|Z_B| << 1. \quad (4)$$

Figure 4:
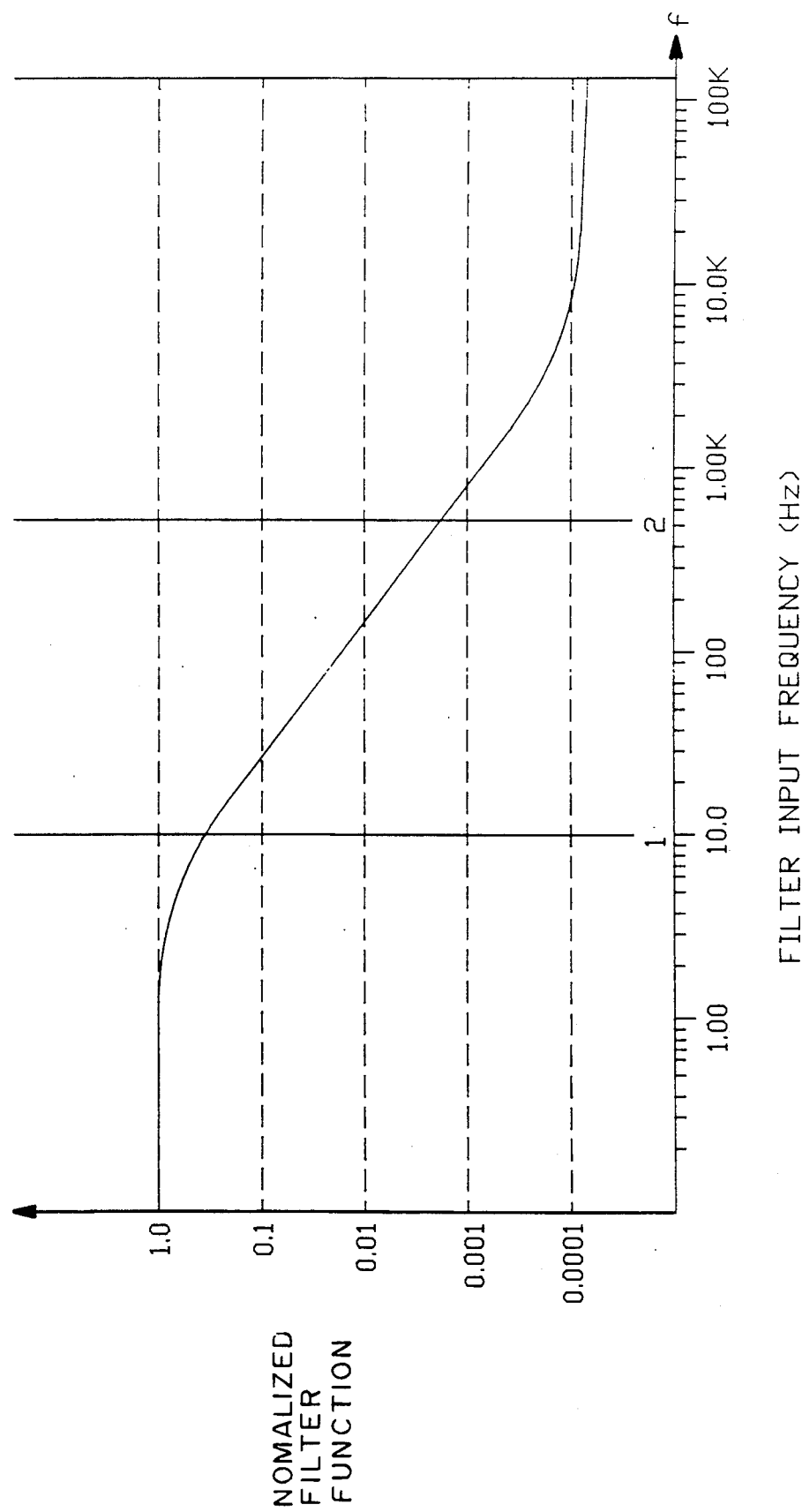
FIG. 4 graphically illustrates the roll-off with increasing frequency of the frequency response of the current drive circuit for the relatively low frequencies that might be used with the invention.

Returning to FIG. 1 again, the current source, including the MOS transistor 35 and the op. amp. 37, produces a current that is proportional to the current level control input signal received at the input terminal 39. The current source has a noise level that is unacceptably high at frequencies above about 20Hz. The current noise level required is 20 picoamps/$\sqrt{Hz}$ at a frequency f=100Hz to 4 picoamps/$\sqrt{Hz}$ at f=1 kHz. In FIG. 1 (and in FIG. 2), the active filter module 27 is placed in parallel with the oscillator coil, and the active filter module 27 in the filtering mode ($Z = Z_A(s)$) is designed to have much lower impedance than the oscillator coil at frequencies above f=10Hz. Thus, the current from the current source to the oscillator coil is low-pass filtered. The active filter module 27 has a much higher internal impedance than the oscillator coil at frequencies far below f=5Hz. The normalized low pass filter function, for the choice of resistance and capacitance values given above, is shown in FIG. 4 as a function of input frequency. This output function begins to roll off at about 7Hz and has decreased by four orders of magnitude by the time the input frequency reaches about 3 kHz. The active filter module 27 shown in FIG. 3 is one form of a Generalized Impedance Converter ("GIC") and is discussed by Burton and Treleaver in "Active filter design using generalized impedance converters", Electronic Data News, 5 Feb. 1973, pp. 68–75. Other GIC configurations would also provide the desired function.

In order to change the current in the oscillator coil from one level to another, the current source input voltage at the input terminal 39 in FIG. 1 or FIG. 2 is set to the level corresponding to the new desired current. The voltage transient present at the node point 31 during slewing of current from one level to another in the oscillator coil would damage the active filter module 27, if the filter module is unprotected. Therefore, the active filter module 27 is removed from the circuit by opening the switch 33 during the occurrence of the current switching transient at the node point 31. After the voltage transient at the node point 31 has passed, the active filter module 27 is reconnected using the switch 33.

The active filter module 27 itself has two modes, as noted above. The filtering mode presents relatively low internal impedance magnitude $|Z_{A2}(s)|$ compared to the oscillator coil impedance magnitude $|Z_c|$ for low pass filtering and presents relatively high impedance magnitude $|Z_{A1}(s)|$ relative to $|Z_c|$ at frequencies below, say, 10Hz. A second mode (non-filtering) presents an internal impedance $Z_B(s)$ that has a very high magnitude $|Z_B(s)|$ compared to $|Z_c|$. The high impedance, nonfiltering mode $Z = Z_B(s)$ of the active filter module 27 is used when the active filter is first reconnected to the remainder of the circuit shown in FIG. 1 or FIG. 2 after change of the current level. In this high impedance mode, the transient response of the active filter module 27 is fast, and the node voltages in the active filter module quickly settle to their steady state values. Once the voltages in the active filter module 27 and current driver circuit have settled, the active filter module 27 can be changed to the filtering mode $Z=Z_A(s)$ without causing a significant transient. This occurs because the dc voltages on the capacitors and dc currents in the inductors in the YIG oscillator circuit are the same for both active filter modes. This function allows fast switching between current levels of the circuits shown in each of FIGS. 1 and 2.

The invention described herein has a number of additional advantages. First, the active filtering function is realized without the use of a capacitor (69) having a large capacitance value such as 140 μf. A capacitor having such a large capacitance would have substantial dc leakage, which could result in frequency error at the oscillator output terminal. Further, use of such a large capacitor would require a proportionately greater charging time with a given current source, or would require use of a proportionately larger current source for the same capacitor charging time. Second, the active filter described here can be realized using standard integrated circuits and resistors and capacitors of modest values, in a configuration that allows at most low dc leakage.

I claim:

1. A rapid switching current drive circuit for facilitating frequency switching of an oscillator, the apparatus comprising:

an oscillator interface circuit, having an oscillator coil with an input terminal to receive an input signal on a signal input line and with an output terminal, the interface circuit including a ferri-resonant oscillator, the oscillator coil having an impedance $Z_c$ and further having voltage control means for controlling the voltage developed between the input terminal and the output terminal of the coil;

a current drive module connected to the signal input line terminal of the oscillator coil to provide a controllably variable current for the circuit; and an active filter, having an input terminal to receive an input signal and an output terminal to issue an output signal, where the active filter has first and second modes of operation and can be rapidly switched between these two modes, where in the first mode the active filter has an impedance $Z_A(f)$, depending upon signal frequency f, that has a much higher magnitude $|Z_{A1}(f)|$ than the coil impedance magnitude $|Z_c|$ if the signal input frequency f is less than a first selected frequency $f_1$, and that has a much lower magnitude $|Z_{A2}(f)|$ than the coil impedance magnitude $|Z_c|$ if the signal input frequency f is greater than a second selected frequency $f_2$, where $0<f_1<f_2$, and where in the second mode the active filter has the frequency dependent impedance $Z_B(f)$ that satisfies the relation $|Z_c|/|Z_B|<<1$.

2. The apparatus of claim 1, further comprising an electronically controllable switch that connects said signal input line to said active filter input terminal in a first switch state and that severs this connection in a second switch state.

3. The apparatus of claim 1, wherein said active filter comprises:

first and second operational amplifiers, each having a positive input terminal, a negative input terminal and an output terminal;

a first impedor having a first terminal connected to said active filter input terminal and to the first operational amplifier positive input terminal;

a second impedor having a first terminal connected to the second terminal of the first impedor and to the output terminal of the second operational amplifier;

a third impedor having a first terminal connected to the second terminal of the second impedor and to the negative input terminals of each of the first and second operational amplifiers;

a fourth impedor having a first terminal connected to the second terminal of the third impedor and to the output terminal of the first operational amplifier, and having a second terminal connected to the second operational amplifier positive input terminal;

a fifth impedor that behaves substantially as a capacitor for low input signal frequencies, having a first input terminal connected to the second terminal of the fourth impedor and having a second terminal connected to said active filter output terminal;

a first switch that, in a first switch state, connects the first and second terminals of the second impedor and, in a second switch state, severs that connection;

a second switch that, in a first switch state, connects the first and second terminals of the third impedor and, in a second switch state, severs that connection; and switch control means connected to the first and second switches for controlling the switch states of these two switches.

4. The apparatus of claim 3, wherein at least one of said first, second, third and fourth impedors is a resistor with a predetermined resistance value.

5. The apparatus of claim 1, wherein said active filter has an impedance that has unbounded magnitude when said input signal frequency approaches zero.

6. The apparatus of claim 1, wherein said ferri-resonant oscillator includes ferri-resonant material drawn from the class consisting of yttrium-iron-garnet and barium ferrite.

7. A rapid switching current drive circuit for facilitating frequency switching of an oscillator, the apparatus comprising:

an oscillator interface circuit, having an input terminal to receive an input signal on a signal input line and having an output terminal, having a first sub-circuit including a first ferri-resonant oscillator and associated oscillator coil, having a second sub-circuit including a second ferri-resonant oscillator and associated oscillator coil, and having a switch that controllably connects the first sub-circuit coil or the second sub-circuit coil to the input terminal, with each of the first and second sub-circuits being connected to the output terminal of the oscillator drive circuit, and with each of the oscillator coils having an impedance $Z_c$ and including voltage control means for controlling the voltage developed between the input terminal and the output terminal of the coil;

a current drive module connected to the input terminal of the oscillator circuit to provide a controllably variable current for the circuit; and an active filter, having an input terminal to receive an input signal and an output terminal to issue an output signal, where the active filter has first and second modes of operation and can be rapidly switched between these two modes, where in the first mode the active filter has an impedance $Z_A(f)$, dependent upon signal frequency f, that has a much higher magnitude $|Z_{A1}(f)|$ than the coil impedance magnitude $|Z_c|$ if the signal input frequency f is less than a first selected frequency $f_1$, and that has a much lower magnitude $|Z_{A2}(f)|$ than the coil impedance magnitude $|Z_c|$ if the signal input frequency f is greater than a second selected frequency $f_2$, where $0<f_1<f_2$, and where in the second mode the active filter has the frequency dependent impedance $Z_B(f)$ that satisfies the relation $|Z_c|/|Z_B|<<1$.

8. The apparatus of claim 7, further comprising an electronically controllable switch that connects the signal input line to said active filter input terminal in a first switch state and that severs this connection in a second switch state.

9. The apparatus of claim 7, wherein said active filter comprises:
- first and second operational amplifiers, each having a positive input terminal, a negative input terminal and an output terminal;
- a first impedor having a first terminal connected to said active filter input terminal and to the first operational amplifier positive input terminal;
- a second impedor having a first terminal connected to the second terminal of the first impedor and to the output terminal of the second operational amplifier;
- a third impedor having a first terminal connected to the second terminal of the second impedor and to the negative input terminals of each of the first and second operational amplifiers;
- a fourth impedor having a first terminal connected to the second terminal of the third impedor and to the output terminal of the first operational amplifier, and having a second terminal connected to the second operational amplifier positive input terminal;
- a fifth impedor that behaves substantially as a capacitor for low signal input frequencies, having a first input terminal connected to the second terminal of the fourth impedor and having a second terminal connected to said active filter output terminal;
- a first switch that, in a first switch state, connects the first and second terminals of the second impedor and, in a second switch state, severs that connection;
- a second switch that, in a first switch state, connects the first and second terminals of the third impedor and, in a second switch state, severs that connection; and
- switch control means connected to the first and second switches for controlling the switch states of these two switches.

10. The apparatus of claim 9, wherein at least one of said first, second, third and fourth impedors is a resistor with a predetermined resistance value.

11. The apparatus of claim 7, wherein said ferri-resonant oscillator includes ferri-resonant material drawn from the class consisting of yttrium-iron-garnet and barium ferrite.

12. The apparatus of claim 7, wherein said active filter has an impedance that has unbounded magnitude when said input signal frequency approaches zero.

13. A method for rapid frequency switching of a ferri-resonant oscillator contained in an oscillator circuit that has an oscillator coil with an input terminal, an output terminal and an associated impedance $Z_c$, the circuit being driven by a current drive module that supplies dc current at a first selected current level and at a second selected current level to the oscillator circuit according to choice, the method comprising the steps of:
- passing a portion of the current supplied by the current drive module through an active filter having an input terminal and an output terminal and being connected in parallel with the oscillator coil, where the active filter has first and second modes of operation and can be rapidly switched between these two modes, where the active filter in the first mode has an impedance $Z_A(f)$ that depends upon input signal frequency f and that satisfies the relations $|Z_A(f)|/|Z_c|>>1$ for $f<f_1$ and $|Z_A(f)|/|Z_c|<<1$ for $f>f_2$, where $f_1$ and $f_2$ are selected frequencies satisfying $0<f_1<f_2$, and where the active filter in the second mode has an impedance $Z_B(f)$ that satisfies the relation $|Z_c|/|Z_B|<<1$ for all frequencies of interest; and
- when the current delivered from the current drive module is to be switched from one current level to the other current level;
- first, disconnecting the active filter from the current drive module,
- second, switching the current level and placing the active filter in the second mode of operation,
- third, reconnecting the active filter to the current drive module and allowing any current or voltage transients within the active filter to be attenuated, and
- fourth, placing the active filter in the first mode of operation.

* * * * *